United States Patent
Liu et al.

(10) Patent No.: US 9,614,187 B1
(45) Date of Patent: Apr. 4, 2017

(54) ELECTRONIC DEVICE PACKAGE AND PACKAGE METHOD THEREOF

(71) Applicant: Industrial Technology Research Institute, Hsinchu (TW)

(72) Inventors: Wen-Hong Liu, Taichung (TW); Hsuan-Yu Lin, Changhua County (TW); Hsin-Chu Chen, Miaoli County (TW); Chih-Ming Lai, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/084,463

(22) Filed: Mar. 29, 2016

(51) Int. Cl.
  *H01L 51/00* (2006.01)
  *H01L 51/52* (2006.01)
  *H01L 51/56* (2006.01)

(52) U.S. Cl.
  CPC ...... *H01L 51/5259* (2013.01); *H01L 51/5246* (2013.01); *H01L 51/5253* (2013.01); *H01L 51/5268* (2013.01); *H01L 51/56* (2013.01)

(58) Field of Classification Search
  CPC . H01L 51/56; H01L 51/5246; H01L 51/5253; H01L 51/5259; H01L 51/5268
  See application file for complete search history.

(56) References Cited

U.S. PATENT DOCUMENTS

| | | | |
|---|---|---|---|
| 9,070,895 B2 | 6/2015 | Lin | |
| 9,548,473 B2* | 1/2017 | Yoo | H01L 51/5259 |
| 2004/0066146 A1* | 4/2004 | Park | G09G 3/3233 315/169.3 |
| 2005/0140308 A1* | 6/2005 | Park | H01L 27/3276 315/169.3 |
| 2005/0162070 A1* | 7/2005 | Park | H01L 27/3251 313/503 |
| 2006/0238462 A1* | 10/2006 | Kim | G09G 3/3208 345/77 |
| 2008/0218066 A1* | 9/2008 | Kim | H01L 51/5231 313/504 |
| 2009/0315450 A1* | 12/2009 | Kim | H01L 27/3258 313/504 |
| 2011/0121350 A1* | 5/2011 | Lee | H01L 51/5246 257/99 |
| 2013/0207541 A1 | 8/2013 | Bouten | |
| 2014/0339517 A1 | 11/2014 | Park et al. | |

FOREIGN PATENT DOCUMENTS

TW  200402012  2/2004

* cited by examiner

*Primary Examiner* — Nicholas Tobergte
(74) *Attorney, Agent, or Firm* — Jianq Chyun IP Office

(57) ABSTRACT

An electronic device package including a substrate, a base film, a first seal, an electronic device and a second seal is provided. The first seal is disposed between the substrate and the base film and partially exposed by the base film. The electronic device is formed on the base film. The second seal disposed on the electronic device includes absorbents. A part of the second seal adheres to a part of the first seal exposed by the base film. The first seal and the second seal encapsulate the base film and the electronic device. The first seal and the second seal are the same host materials. A packaging method of an electronic device package is also provided.

20 Claims, 9 Drawing Sheets

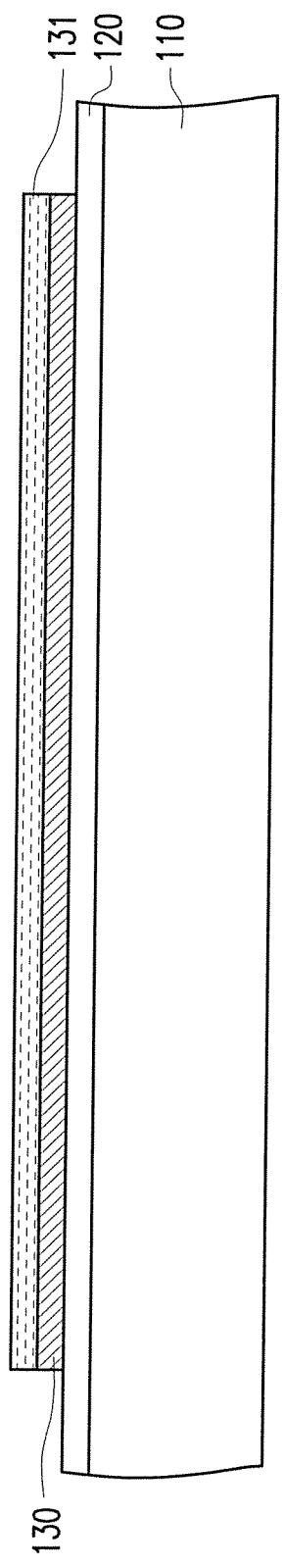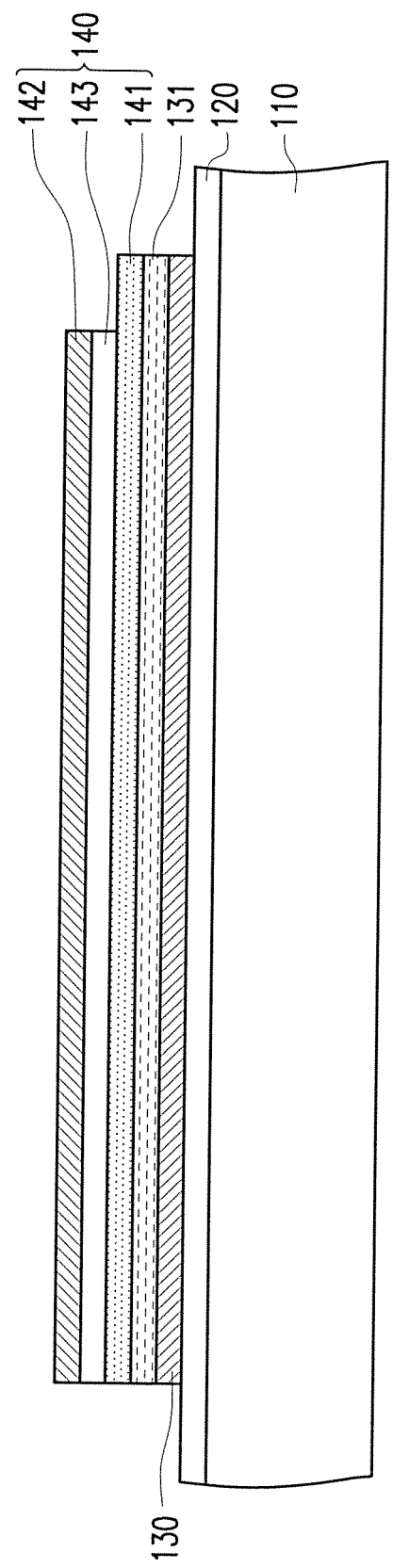
FIG. 5A
FIG. 5B

ELECTRONIC DEVICE PACKAGE AND PACKAGE METHOD THEREOF

BACKGROUND

1. Technical Field

The disclosure relates to an electronic device package and a method for packaging the electronic device.

2. Related Art

With the progress of illumination and display technology, illumination devices and displays have been developed in the trend of slimness and planarization. Flexible illumination devices and displays (for example, foldable displays) have gradually become the next-generation products for their flexibility, ease of carriage, compliance with safety standards, and extensive applications in consumer products. The flexible substrate such as a plastic substrate may have large coefficient of thermal expansion and insufficient resistance to heat, moisture, oxygen, and chemicals. A flexible substrate may serve to hold electronic devices and/or act as a cover, so as to perform a packaging process on the electronic devices. Since the flexible substrate may not block permeation of moisture infiltration and oxygen effectively, the moisture infiltration and the oxygen diffusion may speed up the aging process of the electronic devices on the flexible substrate. The lifetime of the electronic devices may be shortened, and thereby the market demand cannot be satisfied.

However, the organic light-emitting devices are sensitive to moisture and oxygen. Once an organic light-emitting devices contacts moisture and/or oxygen, phenomena of cathode oxidation and peeling of organic compounds may occur, resulting in deteriorated quality, and also reduction in life of the devices. In brief, moisture and oxygen barrier properties of the organic light-emitting devices may have been outstanding issues that urgently need to be solved.

SUMMARY

According to an exemplary embodiment of the disclosure, an electronic device package including a substrate, a base film, a first seal, an electronic device and a second seal is provided. The first seal is disposed between the substrate and the base film and partially exposed by the base film. The electronic device is formed on the base film. The second seal disposed on the electronic device includes absorbents. A part of the second seal adheres to a part of the first seal exposed by the base film. The first seal and the second seal encapsulate the base film and the electronic device. The first seal and the second seal are the same host materials.

An exemplary embodiment of the disclosure provides a method for packaging an electronic device, and the method includes: adhering a base film to a substrate through a first seal between the substrate and the base film; forming an electronic device on the base film, wherein the first seal is partially exposed by the base film and the electronic device; providing a second seal on the electronic device and the first seal, wherein the second seal includes absorbents distributed therein; adhering a part of the second seal to a part of the first seal exposed by the base film, the first seal and the second seal encapsulating the base film and the electronic device, wherein the first seal and the second seal are the same host materials.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 5A to FIG. 5C are schematic cross-sectional views illustrating a method for packaging an electronic device package according to another exemplary embodiment of the disclosure.

DESCRIPTION OF THE EMBODIMENTS

Figure 1:
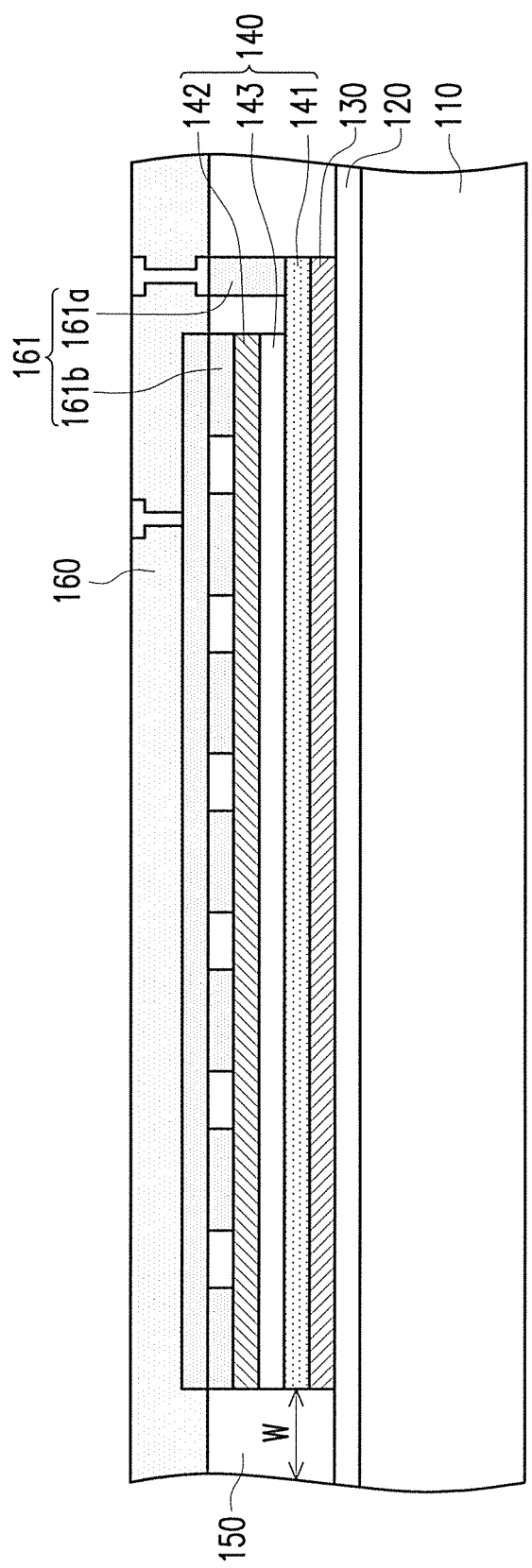
FIG. 1 is a schematic cross-sectional view illustrating an electronic device package according to an exemplary embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a schematic cross-sectional view illustrating an electronic device package 100 according to an exemplary embodiment of the disclosure. Referring to FIG. 1, an electronic device package 100 may include a substrate 110, a base film 130, a first seal 120, an electronic device 140 and a second seal 150. The first seal 120 is disposed between the substrate 110 and the base film 130 and partially exposed by the base film 130. The substrate 110 and the base film 130 are adhered by the first seal 120 therebetween. The electronic device 140 may be formed on the base film 130. The second seal 150 may include absorbents (not shown) be disposed on the electronic device 140. A part of the second seal 150 adheres to a part of the first seal 120 exposed by the base film 130. The first seal 120 and the second seal 150 encapsulate the base film 130 and the electronic device 140. In some embodiments, the electronic device package 100 may further include a circuit board 160 disposed on the second seal 150. The circuit board 160 includes a plurality of conducting elements 161 which embedded in the second seal 150, and the plurality of conducting elements 161 are electrically connected to the electronic device 140. In other words, the circuit board 160 may be electrically connected to the electronic device 140 through the plurality of conducting elements 161 embedded in the second seal 150.

In the present exemplary embodiment, the substrate 110 is a flexible substrate or a rigid substrates (e.g., glass substrates), for instance, and a material of the flexible substrates may be polyethylene (PE), polyethylene carbonate (PEC), polyethylene naphthalate (PEN), polyethersulfone (PES), polymethyl methacrylate (PMMA), polycarbonate (PC), polyimide (PI), thin glass, or metal foil. The aforesaid PE-containing plastic is flexible plastic and may include PEC, PEN, PES, and so forth, for instance. The substrate 110 may be an optical film having light extraction function.

The host materials of the first seal 120 may include acryl-based resin, epoxy-based resin, polyimide (PI), polyethylene (PE), polypropylene (PP), polyethylene terephthalate (PET), polyvinyl chloride (PVC) and polystyrene (PS), but not limited thereto. The base film 130 may be a flexible film, may include polyethylene (PE), polyethylene carbonate (PEC), polyethylene naphthalate (PEN), polymethyl methacrylate (PMMA), polycarbonate (PC), polyimide (PI), thin glass, or metal foil. The refractive index of the first seal 120 may be equal to or greater than a refractive index of the substrate 110. For example, the refractive index of the substrate 110 ranges from 1.6 to 1.7, and the refractive index of the first seal 120 is substantially equal to or greater than 1.6 or 1.7. In some embodiments, the first seal 120 may include light-scatters (e.g., $Al_2O_3$ particles, polysterene particles, or the combination thereof) distributed therein. The particle size of the light-scatters ranges from 30 nm to 70 nm, and the doping ratio of the light-scatters to the first seal 120 is smaller than 70 wt %, for example.

The base film 130 is disposed on a surface of the first seal 120 and is slightly smaller than the substrate 110 and the first seal 120. The surface of the first seal 120 may be partially exposed by the base film 130. In other words, the surface of the first seal 120 may be partially covered by the base film 130 and the periphery of the surface of the first seal 120 is exposed.

Besides, the electronic device 140 is, for instance, a display (e.g., an active type display or a passive type display) or an illumination device. The active type display is, for instance, an active matrix organic light emitting diode (AM-OLED). The passive type display is, for instance, a passive matrix organic light-emitting device (PM-OLED).

Referring to FIG. 1, in the present exemplary embodiment, the electronic device 140 may include a first electrode layer 141, a light emitting layer 143 and a second electrode layer 142. The light emitting layer 143 is disposed between the first electrode layer 141 and the second electrode layer 142. The electronic device 140 may be formed on the base film 130 and has similar size as the base film 130. The surface of the first seal 120 may be partially exposed by the electronic device 140 as well. In some embodiments, the first electrode layer 141 of the electronic device 140 is an anode layer, the second electrode layer 142 of the electronic device 140 is a cathode layer, and the light emitting layer 143 of the electronic device 140 is an organic functional layer at least including an electro-luminance layer. In order to enhance performance of the light emitting layer 143 and/or an electron injection layer (EIL) may be formed between the second electrode layer 142 (i.e. the cathode layer) and the electro-luminance layer while an electron transport layer (ETL) and/or a hole injection layer (HIL) and/or a hole transport layer (HTL) may be formed between the first electrode layer 141 (i.e. the anode layer) and the electro-luminance layer.

In some embodiments, the water vapour transmission rate (WVTR) of the second seal 150 is smaller than $10^{-4}$ $g/m^2$ day at 60 degrees Celsius and a relative humidity of 90% for 1000 hours. After 1000 hours, the water vapour transmission rate (WVTR) of the second seal 150 is about 6 $g/m^2$ day at 60 degrees Celsius and a relative humidity of 90%. In other words, under the circumstance of 60 degrees Celsius and a relative humidity of 90%, the second seal 150 is capable of blocking the water vapour for at least 1000 hours (i.e. lag time for blocking water vapour of the second seal 150 is greater than 1000 hours). The second seal 150 has the same host materials as the first seal 120 and may further include a plurality of absorbents to absorb moisture and oxygen. The absorbents may include sodium polyacrylate, sodium polyacrylonitrile, polyacrylamide, CaO, BaO, SrO, $Al_2O_3$, $SiO_2$, SiO, zeolite or the combination thereof. Referring to FIG. 1, in the present exemplary embodiment, the second seal 150 is disposed on the electronic device 140 and a part of the second seal 150 adheres to the part of the first seal 120 that is exposed by the base film 130. Since the second seal 150 has the same host materials as the first seal 120, adhesion of the second seal 150 and the first seal 120 is good enough to reduce or block infiltration of moisture and oxygen. The base film 130 and the electronic device 140 may be entirely encapsulated and properly protected by the second seal 150 and the first seal 120.

Since the second seal 150 is flexible and thicker than combination of the electronic device 140 and the base film 130, the periphery part of the second seal 150 may extend along sidewalls of the electronic device 140 and the base film 130 and adhere with the part of the first seal 120 exposed by the base film 130. In addition, using the same host materials of the second seal 150 and the first seal 120, a good adhesion of the second seal 150 and the first seal 120 may be provided. The electronic device 140 and the base film 130 are encapsulated and protected by the second seal 150 and the first seal 120. In this embodiment, the periphery part of the second seal 150 may function as a side wall barrier structure and surrounds the sidewalls of the electronic device 140 and the base film 130. The periphery part of the second seal 150 (i.e. side wall barrier structure) has a width W that is smaller than or substantially equal to 2 mm, for instance.

The circuit board 160 may be flexible printed circuit board (FPC), FR-4 printed circuit board or FR-5 printed circuit board. The circuit board 160 may include a plurality of conducting elements 161, such as conductive paste or conductive posts. The circuit board 160 is disposed on the second seal 150 and the conducting elements 161 are embedded in the second seal 150. In addition, the conducting elements 161 may include a plurality of first conducting elements 161a and a plurality of second conducting elements 161b. The first conducting elements 161a are electrically connected to the first electrode layer 141 of the electronic device 140 while the second conducting elements 161b are electrically connected to the second electrode layer 142 of the electronic device 140.

Figure 2:
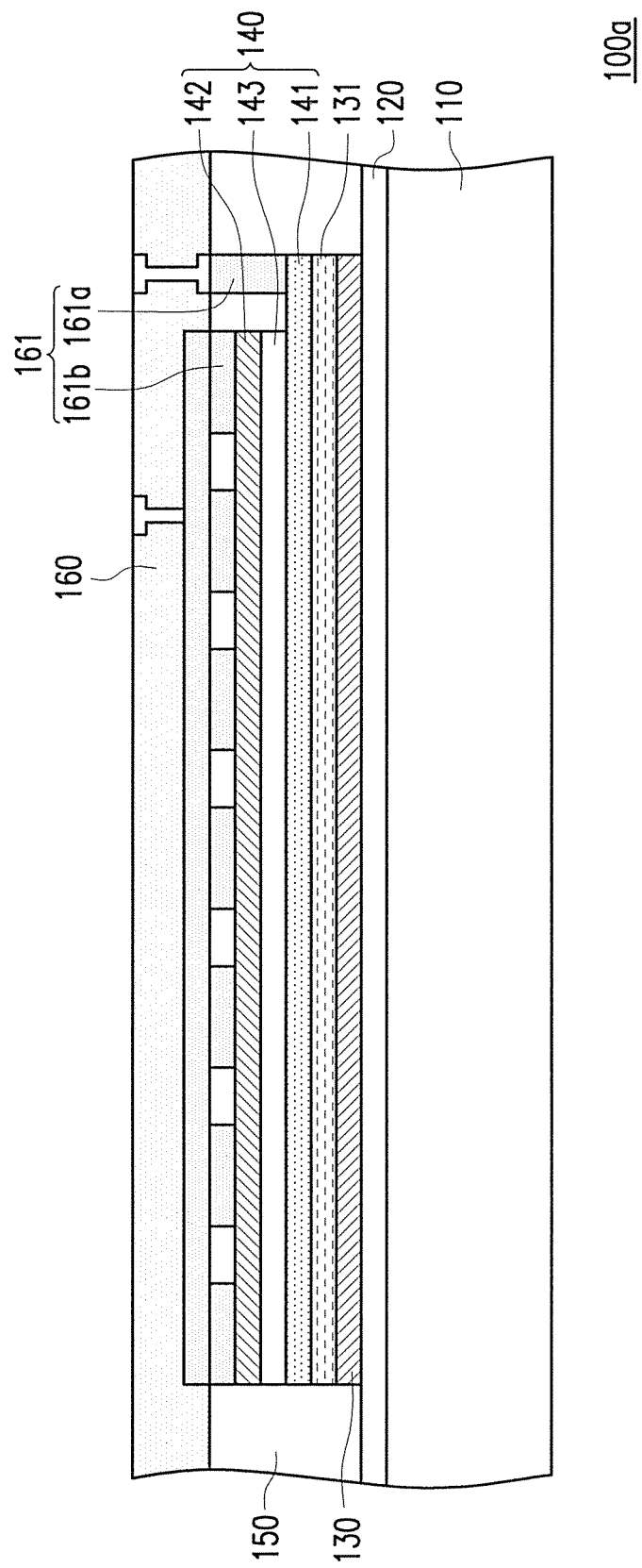
FIG. 2 is a schematic cross-sectional view illustrating an electronic device package according to another exemplary embodiment of the disclosure.
Figure 3:
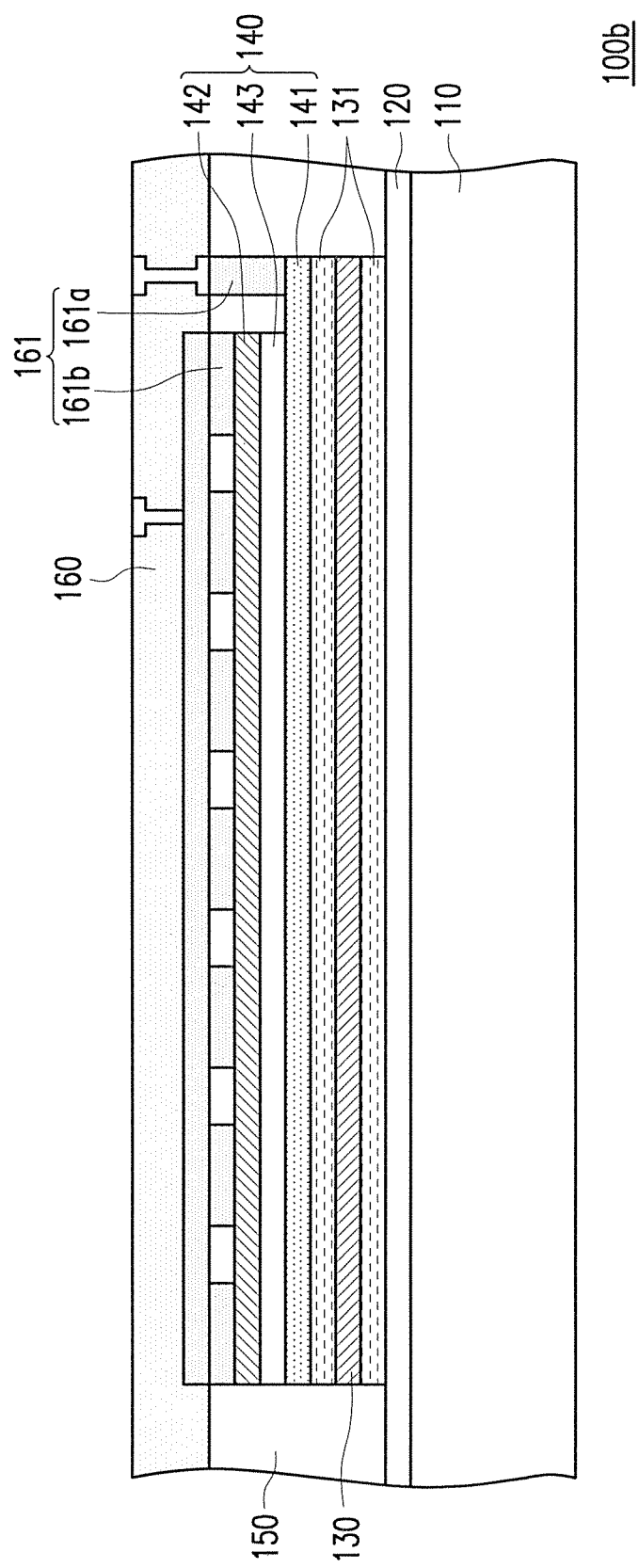
FIG. 3 is a schematic cross-sectional view illustrating an electronic device package according to yet another exemplary embodiment of the disclosure.

FIG. 2 is a schematic cross-sectional view illustrating an electronic device package 100a according to another exemplary embodiment of the disclosure. FIG. 3 is a schematic cross-sectional view illustrating an electronic device package 100b according to another exemplary embodiment of the disclosure.

Referring to FIG. 2, the electronic device package 100a may further include at least one barrier layer 131 formed on at least one surface of the base film 130. For example, the barrier layer 131 is formed on a first surface (e.g., the top surface) of the base film 130 and the first surface is between the electronic device 140 and the base film 130. In another exemplary embodiment of the disclosure the barrier layer 131 is formed on a second surface (e.g., the bottom surface) of base film 130 and the second surface is between the base film 130 and the substrate 110. Referring to FIG. 3, two barrier layers 131 are formed on two opposite surfaces (i.e. the first and second surfaces) of the base film 130, respectively. The base film 130 is disposed between the two barrier layers 131. Introduction of the barrier layer 131 may help blocking from moisture and oxygen without significantly increasing the overall thickness of the electronic device package 100b. The introduction of the barrier layer 131 depends on actual design requirements, the disclosure is not limited thereto. The material of the barrier layer 131 may be silicon oxides (SiOx), silicon nitrides (SiNx), or the combination thereof. In some embodiments, the water vapour transmission rate (WVTR) of the barrier layer 131 is smaller than $10^{-4}$ g/m$^2$ day, for example, at 60 degrees Celsius and a relative humidity of 90% for 1000 hours. For example, the water vapour transmission rate (WVTR) of the barrier layer 131 may be $10^{-5}$ g/m$^2$ day, $10^{-6}$ g/m$^2$ day or even smaller.

Figure 4A:
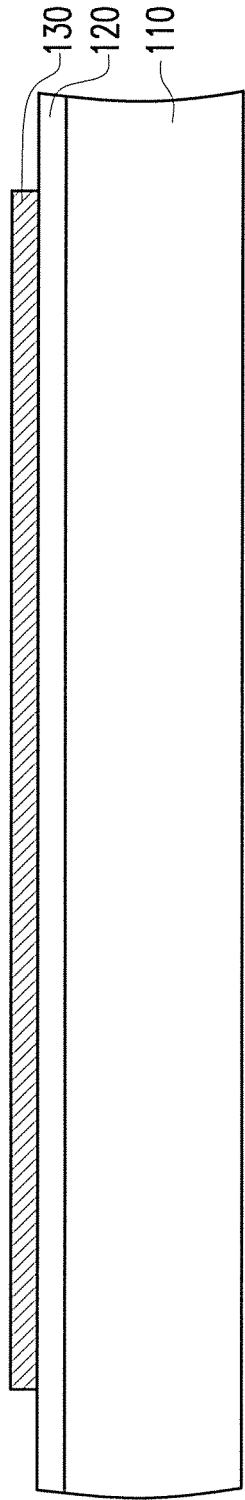
FIG. 4A to FIG. 4C are schematic cross-sectional views illustrating a method for packaging an electronic device package according to an exemplary embodiment of the disclosure.
Figure 4B:
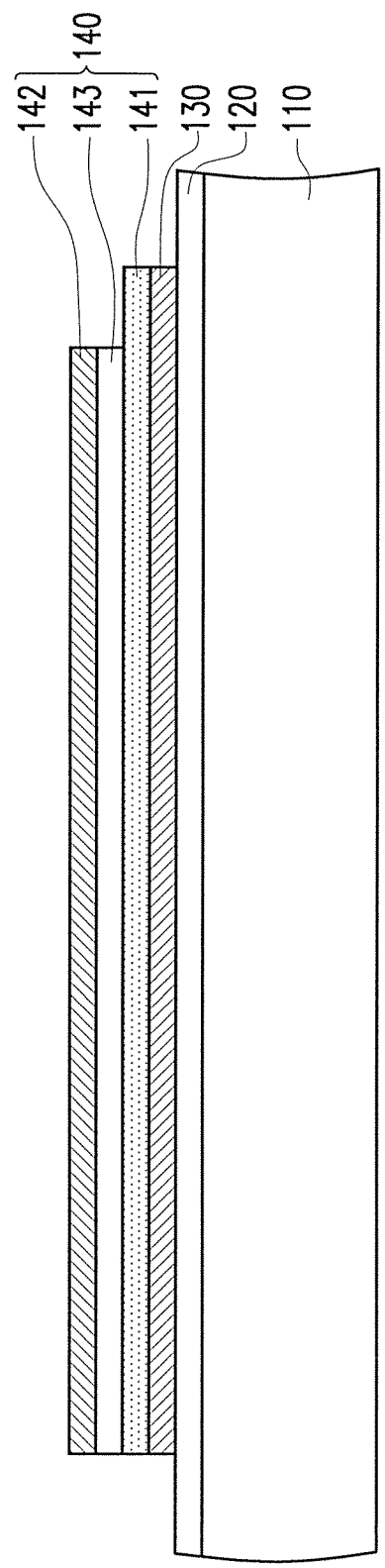
Figure 4C:
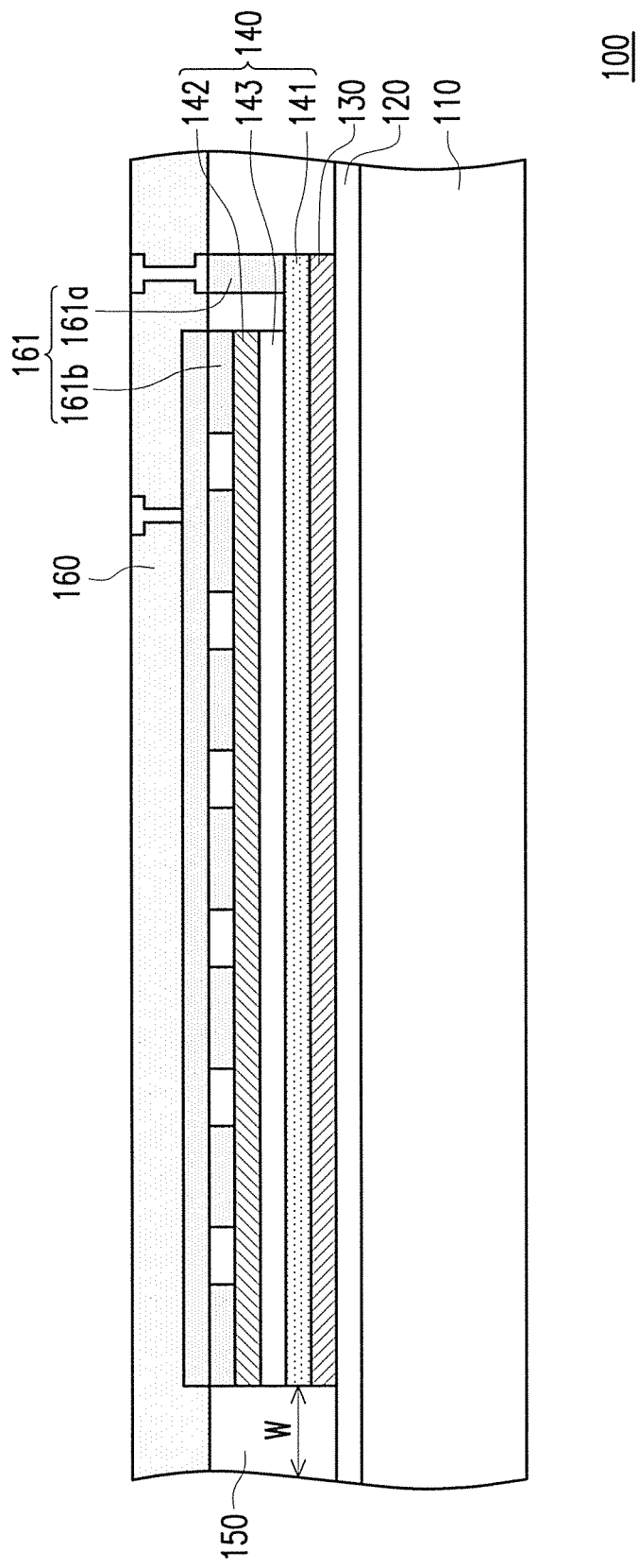

FIG. 4A to FIG. 4C are schematic cross-sectional views illustrating a method for packaging an electronic device package according to an exemplary embodiment of the disclosure.

Referring to FIG. 4A, a first seal 120 is provided between a substrate 110 and a base film 130 such that the base film 130 and the substrate 110 are adhered with each other. The substrate 110 and the base film 130 are adhered with two opposite surfaces of the first seal 120 respectively. Referring to FIG. 4B, an electronic device 140 is formed on the base film 130. In the exemplary embodiment, the electronic device 140 may include a first electrode layer 141, a light emitting layer 143 and a second electrode layer 142. The light emitting layer 143 is disposed between the first electrode layer 141 and the second electrode layer 142. In the exemplary embodiment, the electronic device 140 may be deposited on the base film 130 under room temperature. In the exemplary embodiment, the base film 130 is smaller than the substrate 110 and the first seal 120. The first seal 120 is partially exposed by the base film 130 and the electronic device 140.

Referring to FIG. 4C, a second seal 150 is formed on the electronic device 140 and the first seal 120. The second seal 150 may include absorbents distributed therein. In the exemplary embodiment, the absorbents may be doped in a host material of the second seal 150 after forming the second seal 150 on the electronic device 140 and the first seal 120. In another exemplary embodiment, the absorbents may be premixed with the host material of the second seal 150 before the second seal 150 is formed on the electronic device 140 and the first seal 120. The host material of the second seal 150 is same as that of the first seal 120. The doping/premix ratio of the absorbents to the host material of the second seal 150 is 5 wt %~20 wt %. The second seal 150 may be thicker than combination of the electronic device 140 and the base film 130, the periphery part of the second seal 150 that surround the electronic device 140 may extend along sidewalls of the electronic device 140 and the base film 130 and adhere with the part of the first seal 120 exposed by the base film 130. In addition, using the same host materials of the second seal 150 and the first seal 120, a good adhesion of the first seal 120 and the second seal 150 may be provided. The electronic device 140 and the base film 130 are encapsulated and protected by the second seal 150 and the first seal 120.

Furthermore, referring to FIG. 4C, before the step of forming the second seal 150 on the electronic device 140 and the first seal 120, the packaging method may further include providing a circuit board 160 including a plurality of conducting elements 161. The circuit board 160 is adhered with the second seal 150 and the conducting elements 161 are embedded in the second seal 150 thereby. The circuit board 160 is then laminated onto the electronic device 140 through the second seal 150 while the conducting elements 161 embedded in the second seal 150 are electrically connected to the electronic device 140. In other words, the circuit board 160 may be electrically connected to the electronic device 140 through the plurality of conducting elements 161 embedded in the second seal 150.

Figure 5C:
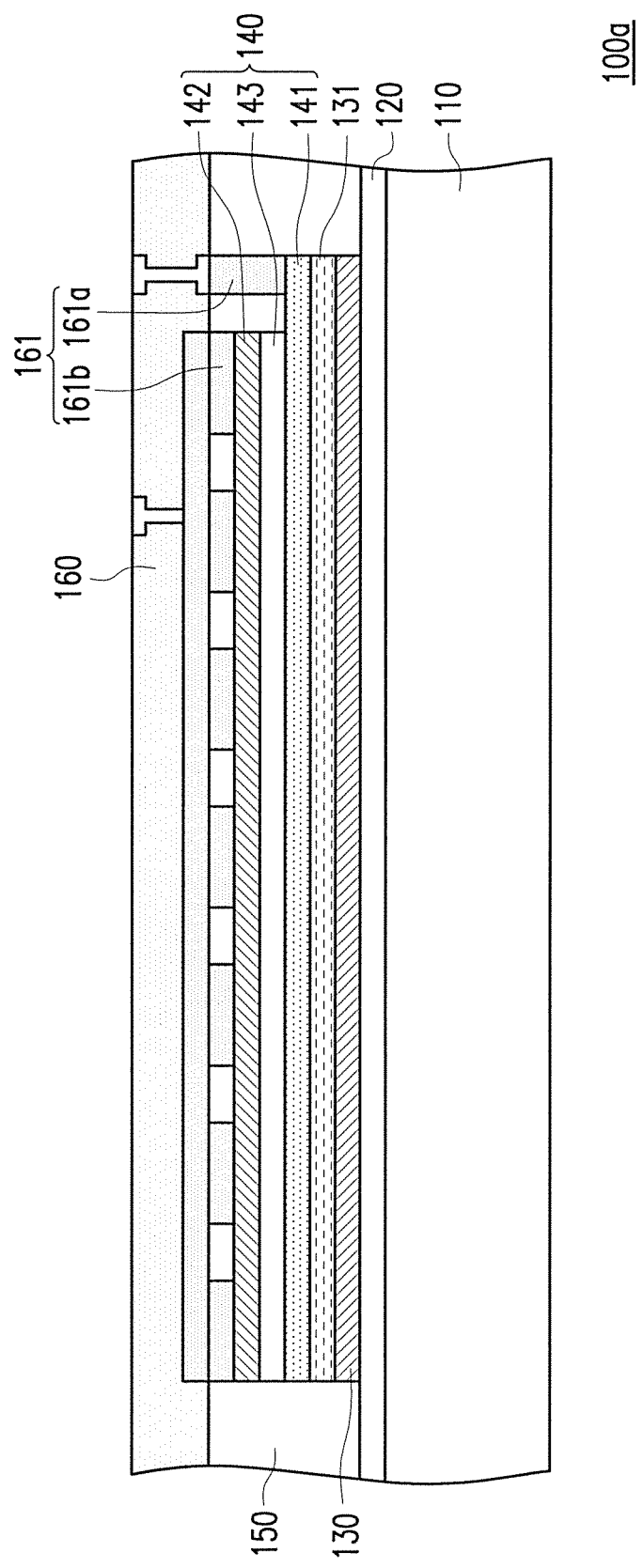
Figure 6A:
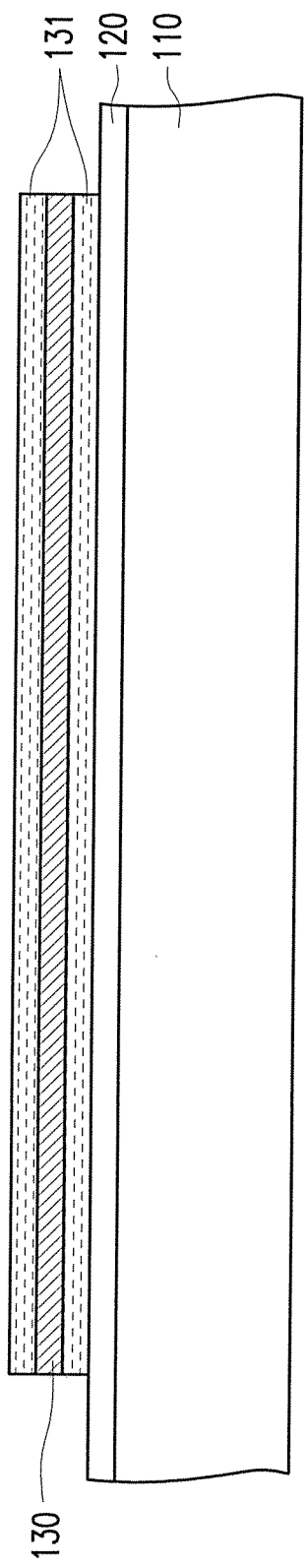
FIG. 6A to FIG. 6C are schematic cross-sectional views illustrating a method for packaging an electronic device package according to yet another exemplary embodiment of the disclosure.
Figure 6B:
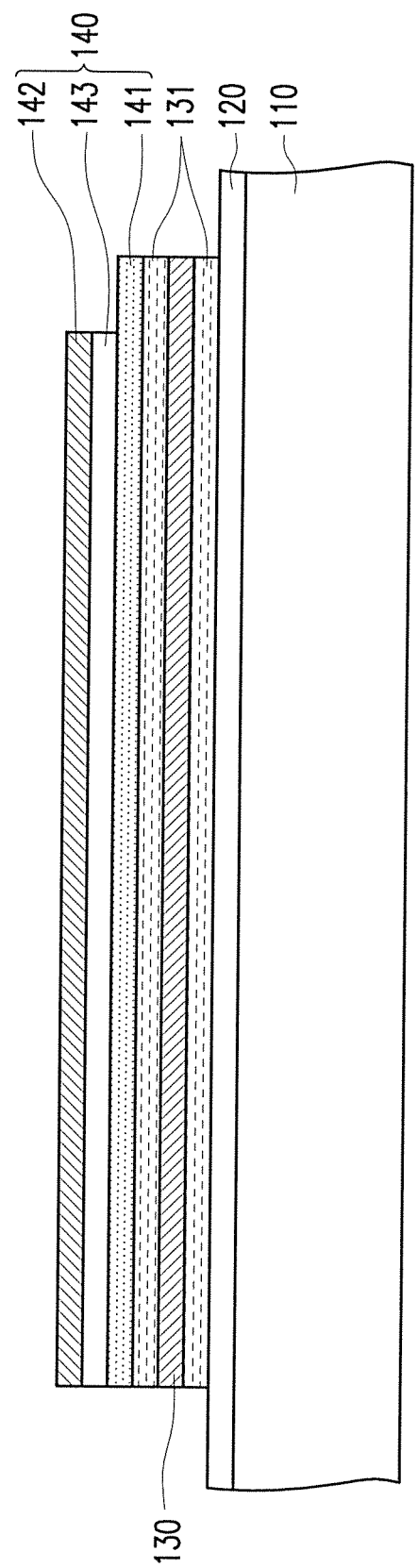
Figure 6C:
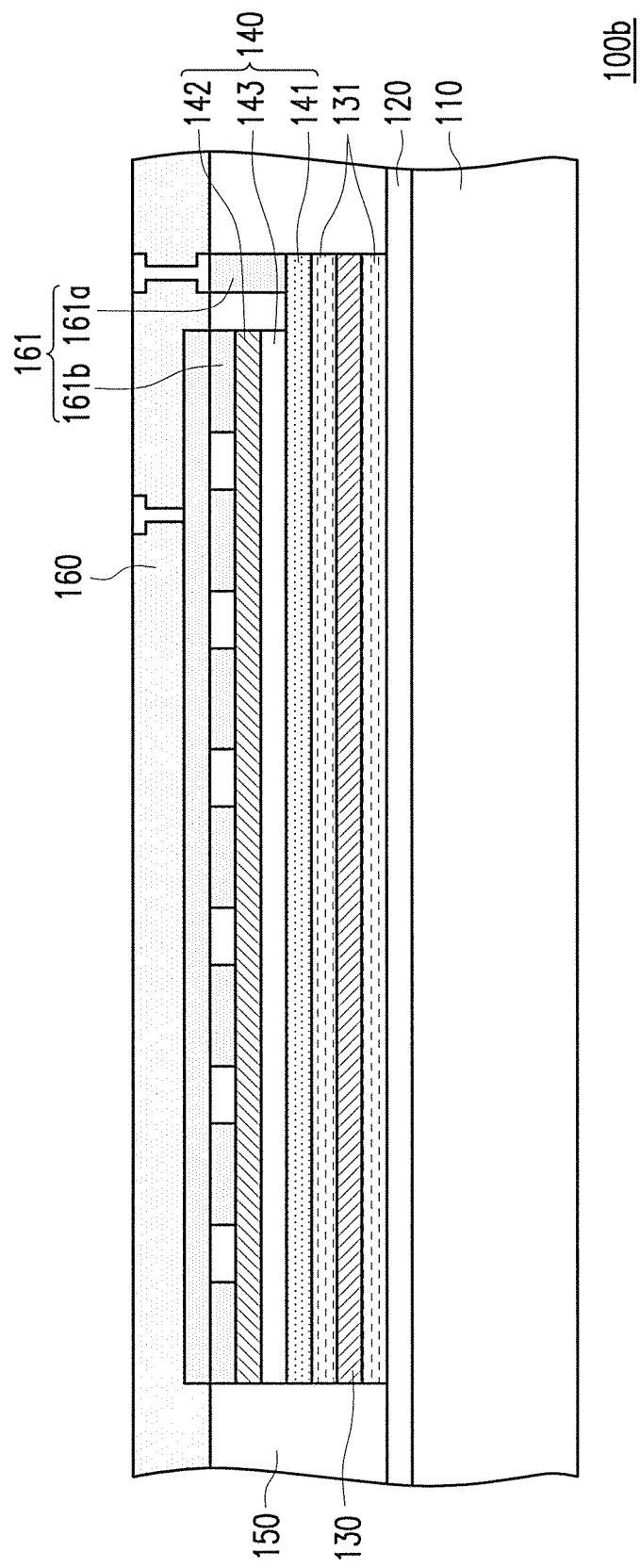

FIG. 5A to FIG. 5C are schematic cross-sectional views illustrating a method for packaging an electronic device package 100a according to another exemplary embodiment of the disclosure. FIG. 6A to FIG. 6C are schematic cross-sectional views illustrating a method for packaging an electronic device package 100b according to yet another exemplary embodiment of the disclosure. The packaging methods depicted from FIG. 5A to FIG. 5C and FIG. 6A to FIG. 6C are similar with those from FIG. 4A to FIG. 4C, and the packaging methods depicted from FIG. 5A to FIG. 5C and FIG. 6A to FIG. 6C may further include forming at least one barrier layer 131 on at least one surface of the base film 130 before or after the step of adhering the base film 130 to the substrate 110 through the first seal 120.

Referring to FIG. 5A, the barrier layer 131 is formed on a first surface (e.g., the top surface) of the base film 130 before adhering with the substrate 110 through the first seal 120, for instance. The first surface of the base film 130 is between the electronic device 140 and the base film 130. The base film 130 and the substrate 110 are adhered by the first seal 120 therebetween. In another exemplary embodiment, the barrier layer 131 is formed on a second surface (e.g., the bottom surface) of base film 130 and the second surface is between the base film 130 and the substrate 110. The barrier layer 131 and the substrate 110 are adhered by the first seal 120 therebetween. Besides, referring to FIG. 6A, two barrier layers 131 are formed on two opposite surfaces (i.e. the first and second surfaces) of the base film 130 respectively. In other words, the base film 130 is disposed between the two barrier layers 131. Thus, the barrier layer 131 formed on the second surface of the base film 130 and the substrate 110 is adhered by the first seal 120 therebetween. Introduction of the barrier layer 131 may help blocking from moisture and oxygen without significantly increasing the overall thickness of the electronic device package 100b. The introduction of the barrier layer 131 depends on actual design requirements, the disclosure is not limited thereto.

The exemplary embodiments of the disclosure provide an encapsulation structure for packaging the electronic device 140. Due to the same host materials of the second seal 150 and the first seal 120, the encapsulation structure provides capability to block moisture and oxygen. The electronic device package and a packaging method thereof as described in the above-mentioned exemplary embodiments of the disclosure may enhance reliability and lifetime of electronic devices.

It will be clear that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. An electronic device package, comprising:
   a substrate;
   a base film;
   a first seal disposed between the substrate and the base film, wherein the first seal is partially exposed by the base film;
   an electronic device formed on the base film; and a second seal disposed on the electronic device, the second seal comprising absorbents, wherein a part of the second seal adhere to a part of the first seal exposed by the base film, the first seal and the second seal encapsulate the base film and the electronic device, and the first seal and the second seal are the same host materials.

2. The electronic device package according to claim 1 further comprising:
a circuit board comprising a plurality of conducting elements, wherein the circuit board is disposed on the second seal and the plurality of conducting elements are embedded in the second seal, and the plurality of conducting elements are electrically connected to the electronic device.

3. The electronic device package according to claim 1, wherein the electronic device comprises a first electrode layer, a light emitting layer and a second electrode layer, and the light emitting layer is disposed between the first electrode layer and the second electrode layer.

4. The electronic device package according to claim 1 further comprising at least one barrier layer formed on at least one surface of the base film.

5. The electronic device package according to claim 4, wherein a material of the at least one barrier layer comprises silicon oxides, silicon nitrides, or the combination thereof.

6. The electronic device package according to claim 4, wherein a water vapour transmission rate (WVTR) of the at least one barrier layer is smaller than $10^{-4}$ g/m$^2$ day at 60 degrees Celsius and a relative humidity of 90% for 1000 hours.

7. The electronic device package according to claim 1, wherein the absorbents comprising sodium polyacrylate, sodium polyacrylonitrile, polyacrylamide, CaO, BaO, SrO, $Al_2O_3$, $SiO_2$, SiO, zeolite, or the combination thereof.

8. The electronic device package according to claim 1, wherein a refractive index of the first seal equals to or greater than a refractive index of the substrate.

9. The electronic device package according to claim 1, wherein the first seal comprises light-scatters distributed therein.

10. The electronic device package according to claim 9, wherein a particle size of the light-scatters ranges from 30 nm to 70 nm.

11. The electronic device package according to claim 9, wherein a doping ratio of the light-scatters to the first seal is smaller than 70 wt %.

12. The electronic device package according to claim 9, wherein a water vapour transmission rate (WVTR) of the second seal is smaller than $10^{-4}$ g/m$^2$ day at 60 degrees Celsius and a relative humidity of 90% for 1000 hours.

13. The electronic device package according to claim 12, wherein the water vapour transmission rate (WVTR) of the second seal is about 6 g/m$^2$ day at 60 degrees Celsius and a relative humidity of 90% after 1000 hours.

14. The electronic device package according to claim 9, wherein the light-scatters comprising $Al_2O_3$ particles, polysterene particles or the combination thereof.

15. A method for packaging an electronic device package, comprising:
adhering a base film to a substrate through a first seal between the substrate and the base film;
forming an electronic device on the base film, wherein the first seal is partially exposed by the base film and the electronic device;
providing a second seal on the electronic device and the first seal, wherein the second seal comprises absorbents distributed therein; and
adhering a part of the second seal to a part of the first seal exposed by the base film, the first seal and the second seal encapsulating the base film and the electronic device, wherein the first seal and the second seal are the same host materials.

16. The method according to claim 15 further comprising:
providing a circuit board comprising a plurality of conducting elements;
adhering the circuit board with the second seal, wherein the conducting elements are embedded in the second seal; and
laminating the circuit board onto the electronic device through the second seal, wherein the conducting elements are electrically connected to the electronic device.

17. The method according to claim 15 further comprising:
forming at least one barrier layer on at least one surface of the base film.

18. The method according to claim 15, wherein the electronic device is deposited under room temperature.

19. The method according to claim 15, wherein the absorbents are doped into the second seal after adhering the part of the second seal to the part of the first seal exposed by the base film.

20. The method according to claim 15, wherein the absorbents are premixed with the host materials of the second seal before the second seal is provided on the electronic device and the first seal.

* * * * *